(12) United States Patent
Gutierrez

(10) Patent No.: US 6,680,991 B1
(45) Date of Patent: Jan. 20, 2004

(54) DETECTION OF FREQUENCY DIFFERENCES BETWEEN SIGNALS

(75) Inventor: Germán Gutierrez, Carlsbad, CA (US)

(73) Assignee: Centellax, Inc., Santa Rosa, CA (US)

( * ) Notice: Subject to any disclaimer, the term of this patent is extended or adjusted under 35 U.S.C. 154(b) by 0 days.

(21) Appl. No.: 10/263,066

(22) Filed: Oct. 1, 2002

Related U.S. Application Data
(60) Provisional application No. 60/365,476, filed on Mar. 18, 2002.

(51) Int. Cl.[7] ................................. H03D 3/24
(52) U.S. Cl. ................... 375/373; 375/326; 375/344; 375/371
(58) Field of Search ....................... 375/324, 326, 375/327, 344, 354, 357, 371, 373, 374, 375, 376; 331/1 A, 1 R, 18, 25, 34, 37, 40; 327/212, 159, 156; 370/395.62, 503, 516; 455/182.2, 192.2, 255

(56) References Cited

U.S. PATENT DOCUMENTS

| | | | | |
|---|---|---|---|---|
| 5,629,651 A | * | 5/1997 | Mizuno ...................... | 331/34 |
| 6,081,572 A | * | 6/2000 | Filip ......................... | 375/376 |
| 6,242,956 B1 | * | 6/2001 | McCollough et al. ....... | 327/159 |
| 6,314,150 B1 | * | 11/2001 | Vowe ........................ | 375/374 |

OTHER PUBLICATIONS

Gutierrez, G. et al; *2.488 Gb/s Silicon Bipolar Clock and Data Recovery IC for SONET OC–48)*, IEEE 1998 Custom Integrated Circuits Conference, pp. 575–578.

Gutierrez, G. et al.; *Unaided 2.5 Gv/s Silicon Bipolar Clock and Data Recovery IC*, 1998 IEEE Radio Frequency Integrated Circuits Symposium, pp. 173–176.

Kim, D. et al: *A 1.0Gbps Clock and Data Recovery Circuit with Two—XOR Phase–Frequency Detector*, Dept. of Electrical and Computer Engineering, Inha University, Inchon 402–751, Korea.

Müller, E.; *A 20 Gbit/s Parallel Phase Detector and Demultiplexer Circuit in a Production Silicon bipolar Technology with fT=25 GHz*, IEEE BCTM 2.2, pp. 43–45.

Noguchi, H. et al; *A 9.9G–10.8Gb/s Rate–Adaptive Clock and Data–Recovery with No External Reference Clock for WDM Optical Fiber Transmission*, ISSCC 2002 Session 15 Gigabit Communications, Paper 15.3.

Pottbäcker, A. et al.; *A Si Bipolar Phase and Frequency Detector IC for Clock Extraction up to 8 Gb/s*, IEEE Journal of Solid–State Circuits, vol. 27, No. 12, Dec. 1992.

Savoj, J. et al.; *Design of Half–Rate Clock and Data Recovery Circuits for Optical Communications Systems*, DAC 2001, Jun. 18–22, 2001, Las Vegas, Nevada, Copyright 2001.

Wang, H. et al.; *A1Gb/s CMOS Clock and Data Recovery Circuit*, 1999 IEEE International Solid–State Circuits Conference, ISSCC99, Feb. 17, 1999, Session 20, Paper 20.5.

Wurzer, M. et al.; *40 Gb/S Inegrated Clock and Data Recovery Circuit in a Silicon Bipolar Technology*, IEEE BCTM 8.1. pp. 136–139.

* cited by examiner

*Primary Examiner*—Chieh M. Fan
(74) *Attorney, Agent, or Firm*—Fenwick & West LLP

(57) ABSTRACT

A lock detector is described for detecting a difference between the frequencies of a first and a second input signal. The lock detector includes first and second beat generators configured to generate corresponding beat signals based on the first and second input signals. The second beat signal is phase shifted relative to the first beat signal. A chatter elimination module combines the two chattery beat signals to produce a third corresponding beat signal that is substantially free of chatter. Using this clean beat signal and either of the input signals, a lock detection module produces a lock detection signal, which indicates whether the difference between the frequencies of the first and second input signals is within a prescribed tolerance.

21 Claims, 4 Drawing Sheets

DETECTION OF FREQUENCY DIFFERENCES BETWEEN SIGNALS

CROSS REFERENCE TO RELATED APPLICATIONS

This application claims the benefit under 35 U.S.C. § 119(e) of U.S. Provisional Application No. 60/365,476, filed Mar. 18, 2002, which is hereby incorporated in its entirety by reference.

BACKGROUND

1. Field of the Invention

This invention relates to the measurement of relative frequencies between and more particularly, to the detection of a frequency difference above an allowable threshold.

2. Background of the Invention

In many high-speed communications applications, such as the Synchronous Optical Network (SONET) communication standard, a transceiver receives an incoming data signal that contains an embedded clock signal. The embedded clock signal in the incoming signal corresponds to a reference frequency, which is a master clock for the system. A clock recovery unit (CRU), or a clock and data recovery (CDR) circuit, recovers the embedded clock signal from the incoming data signal. The CRU uses this recovered clock signal to phase-lock a local oscillator to the edges of the incoming data signal, wherein the local oscillator is synchronized and trained to the frequency of the recovered clock signal. The local oscillator is then used to generate a local clock signal to process and re-time the data received in the incoming signal.

Because the local oscillator's clock signal is used to retrieve the data from the incoming signal, it is important that the local oscillator be very close to a multiple of the reference frequency. Otherwise, if the frequency difference between the local oscillator and a multiple of the reference deviates by more than a tolerable amount, the system may not properly decode the data from the incoming signal. Therefore, it is desirable to measure the frequency of the local oscillator relative to the reference signal to determine whether the locally-generated clock signal is close enough in frequency to the reference signal. This measurement is used to perform lock detection. If the local oscillator is not locked to the correct frequency, the system may have to correct the problem, such as by retraining the local oscillator.

FIG. 1 shows a simplified block diagram of one type of CRU for performing recovery, re-timing, and lock detection of an incoming data signal. This CRU is based on a phase-locked loop (PLL) that contains a digital frequency and phase detector (DFPD) 105, known as a digital quadricorrelator, which can extract the information from the incoming data without requiring an external clock reference for frequency acquisition. The incoming data is compared against an internal voltage controlled oscillator (VCO) in the DFPD 105. Its output is differentially filtered by filter 110 and applied to the oscillator 115. The data is re-timed by a D flip-flop 125 using the inverted in-phase VCO clock output.

A lock detector 130 compares a reference input, REF, against the VCO 115 (e.g., divided by 16). The lock detector 130 determines whether the frequency difference between the local oscillator 115 and the reference signal is within a prescribed tolerance. The lock detector 130 will alert the circuit to such a problem so that the circuit can take appropriate action. For example, if the relative error between the two signals' frequencies is too large, the CRU can be commanded to directly train its oscillator to a multiple of the reference frequency.

FIG. 2 shows a proposed lock detector 130, which works as a relative frequency measuring system. This lock detector 130 determines if an optional reference and the internally divided-down VCO 115 are different by more than a preset percentage. The basis of its operation is the generation of a beat frequency between the two inputs by the use of a pair of flip-flops 205,210. This beat signal enables a counter 215 that counts either the reference or the divided-down VCO 115. If the two inputs are close in frequency, then a high count will occur during the beat signal high state. Then the counter 215 will "overflow" and disarm a trip point set by the beginning of the beat waveform by an S-R flip-flop 220. Accordingly, this sets a "locked" signal that indicates whether the two inputs have frequencies within the preset percentage tolerance.

It has been found, however, that the lock detector 130 of FIG. 2 is unreliable due to minor deviations of the input signals, specifically variations in period frequency displacements from the signals' ideal locations. This phenomenon is commonly called jitter. When jittery input signals are combined to form a beat signal, these period frequency deviations will cause the beat signal to "chatter" as one input signal overtakes the other. Chatter is characterized by a signal that beats with hesitation (i.e., goes up and down before settling in a final value) at the rising and/or falling edges of the signal. Because the beat signal is used to enable the counter 215 and set the TRIP bit (which ultimately sets the LOCKED bit), any chatter in the beat signal can cause the system to not operate correctly. For example, the chatter can prematurely reset the counter 215, or it can fail to keep the TRIP and LOCKED bits at their appropriate high or low value.

Other conventional solutions for lock detection typically include at least twice as many components as the lock detector of FIG. 2 and are significantly more complex. In addition, such conventional solutions are not easily programmable. It is therefore desirable to develop a lock detector that will detect frequency differences between signals and produce a reliable lock detection signal, while avoiding the problems of conventional solutions.

SUMMARY OF THE INVENTION

A lock detector is described for detecting a difference between the frequencies of a first and a second input signal. The lock detector includes first and second beat generators configured to generate corresponding beat signals based on the first and second input signals. The second beat signal is phase shifted relative to the first beat signal. A chatter elimination module combines the two chattery beat signals to produce a third corresponding beat signal that is substantially free of chatter. Using this clean beat signal and either of the input signals, a lock detection module produces a lock detection signal, which indicates whether the difference between the frequencies of the first and second input signals is within a prescribed tolerance. In one embodiment of the invention, the lock detector is implemented using various arrangements of flip-flops, counters, and other standard logic and circuit components.

The present invention has many advantages over conventional systems and methods. For example, the present invention uses fewer components, which saves power, requires less area, and is easy to implement. Moreover, the use of a counter or similar components in the lock detection module allows the system to be easily programmed for different tolerances in frequency difference. The system is also advantageously not affected by the relative sign of the frequency measurement (i.e., which input's frequency is higher than the other). Lastly, the system avoids the problems of chatter by producing a clean beat signal and using that clean signal to control the system.

DETAILED DESCRIPTION OF THE PREFERRED EMBODIMENTS

Figure 1:
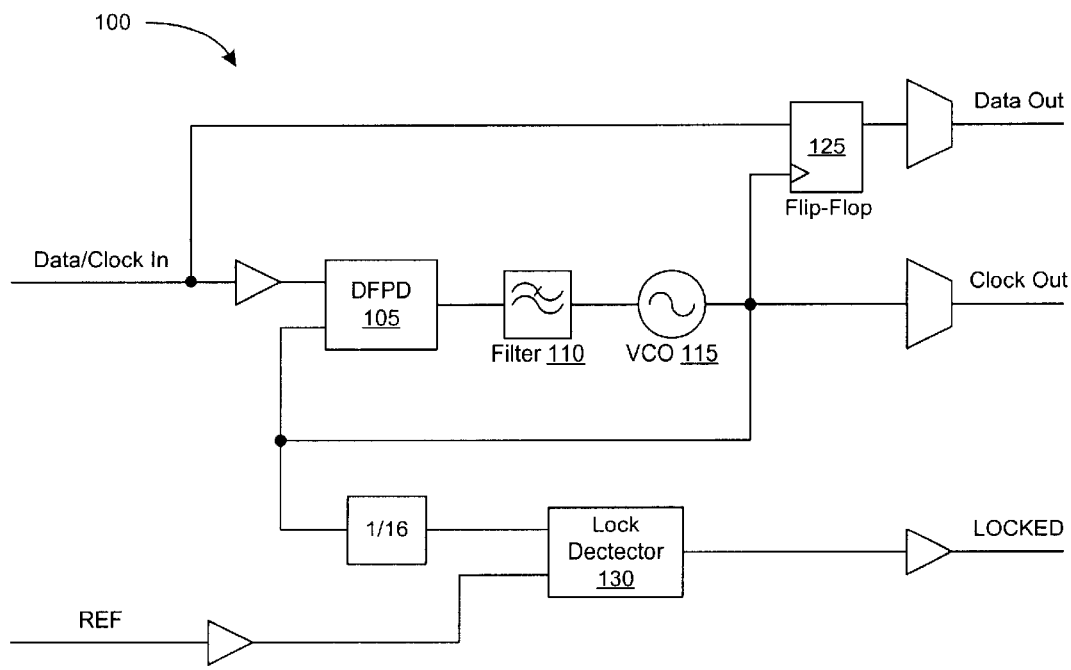
FIG. 1 is a simplified block diagram of a conventional clock recovery unit (CRU).
Figure 2:
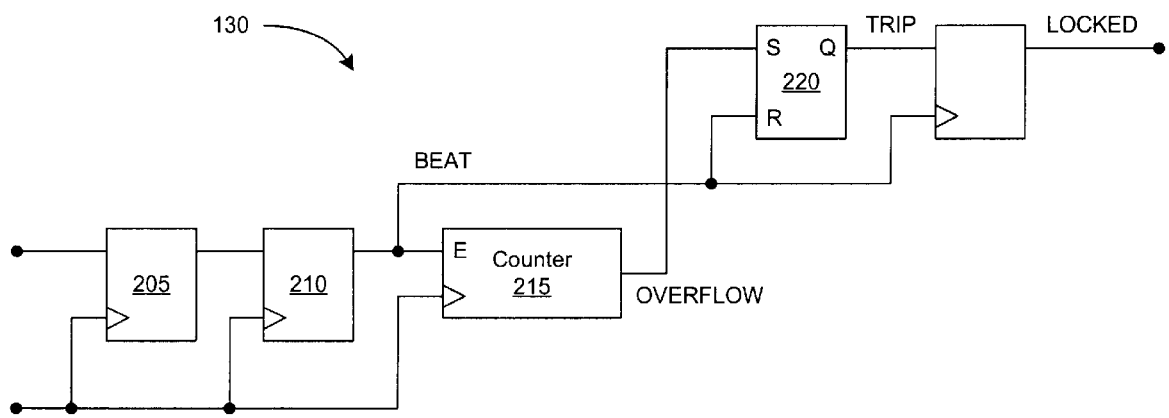
FIG. 2 is a schematic diagram of a prior art lock detector 130 for the CRU of FIG. 1.
Figure 3:
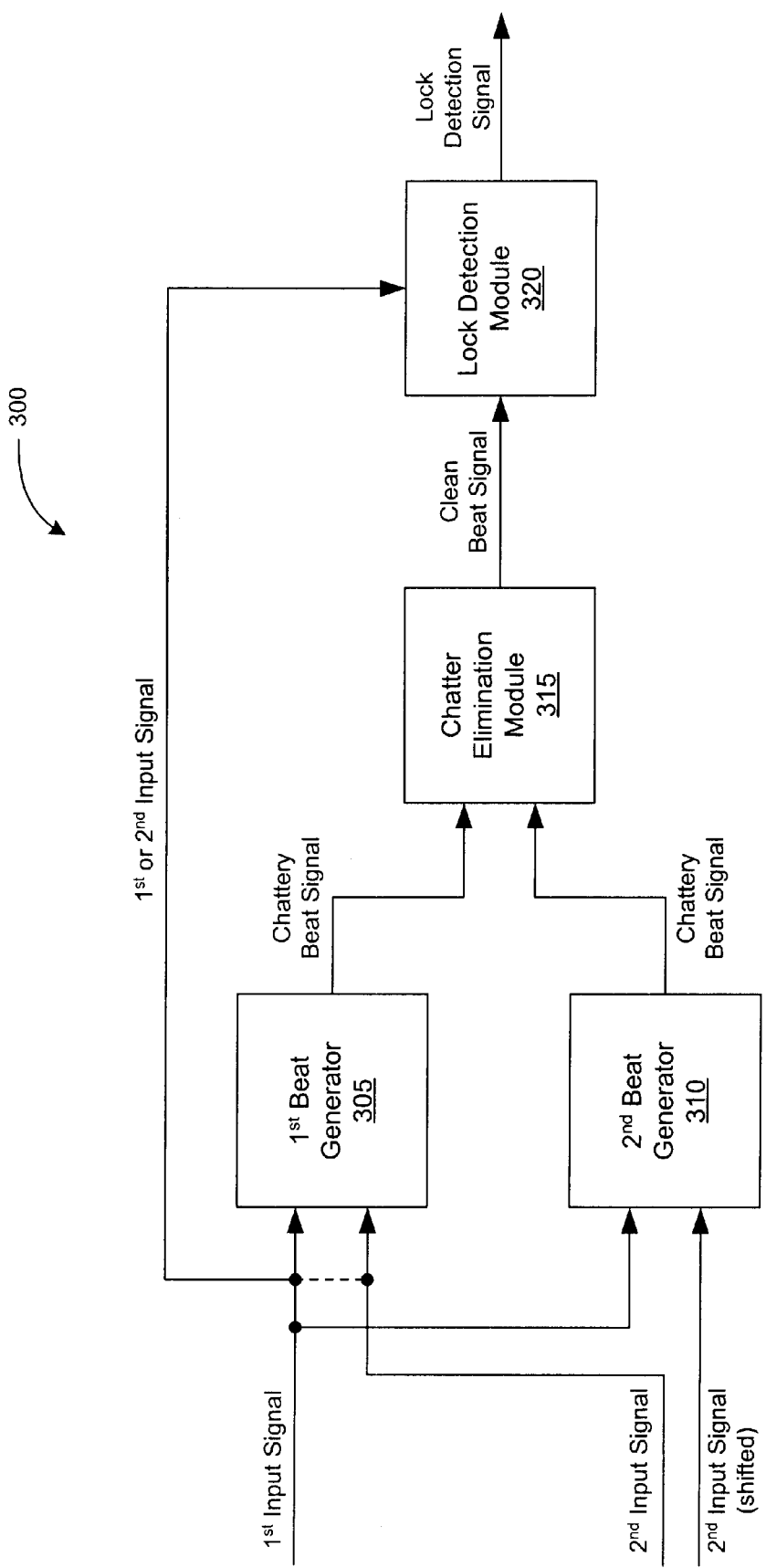
FIG. 3 is a functional block diagram of a lock detector in accordance with an embodiment of the invention.

FIG. 3 shows a block diagram of a lock detector 300 in accordance with an embodiment of the invention. The lock detector 300 detects a difference between the frequencies of a first and a second input signal and produces a lock detection signal based upon that determination. The lock detector 300 operates by generating a beat signal between the two input signals and counting the cycles of either input signal that occur during at least a portion of the beat signal. Because the number of cycles that occur per beat cycle will increase as the frequencies approach each other, this count can be related to the percentage frequency difference between the two input signals. Moreover, the lock detector 300 avoids the problem of chatter in the beat signal by producing two beat signals that are shifted in phase relative to each other, and then combining the beat signals to form a clean beat signal.

The lock detector 300 includes a first beat generator 305 and a second beat generator 310. Each beat generator 305,310 is adapted to generate a beat signal between the two input signals. The first beat generator 305 is configured to receive the first and second input signals, and the second beat generator 310 is configured to receive the first input signal and a phase shifted second beat signal. The phase shifted version of the second input signal may be obtained by passing the signal through a phase shifting component, or it may be directly provided by the source that provides the non-phase shifted second signal. For example, a typical voltage controlled oscillator (VCO) provides a clock signal and its quadrature clock signal, the same signal phase shifted by one quarter of a cycle. In addition, persons skilled in the art will recognize many other methods for providing a shifted second signal.

By shifting the phase of one of the input signals coupled to one of the beat generators (the second input signal coupled to the second beat generator 310 in this example), the corresponding generated beat signal is shifted. Because the generated first and second beat signals may have chatter near their rising and falling edges, it is desirable that the beat signals be phase shifted relative to each other so that time during which one of the beat signals chatters does not overlap the time when the other beat signal chatters. Accordingly, while one of the beat signals is chattering, the other beat signal remains constant in its high or low state. This allows the beat signals to be combined by a chatter elimination module 315 to generate a clean beat signal devoid of chatter. Specific implementations of the chatter elimination module 315 are described in detail below in connection with FIGS. 4 and 6.

A lock detection module 320 is in communication with the chatter elimination module 315 for receiving this clean beat signal. The lock detection module 320 is further coupled to receive either the first or the second input signal. Using the clean beat signal and one of the input signals, the lock detection module 320 produces a lock detection signal. The lock detection signal indicates whether the frequencies of the first and second input signals are within a prescribed tolerance. For example, the lock detection signal may comprise a single bit line, which is high when the lock detector 300 determines that the input signals are close together in frequency. In one embodiment, the lock detection module 320 determines whether the input signals are within a prescribed percentage based on the number of cycles that occur in one of the input signals during at least a portion of the clean beat signal. This number of cycles is related to the percentage difference between the two input signals by the equation:

$$\Delta \omega = \left(\frac{1}{2N}\right) \cdot 100\%,$$

where N is the number of cycles of an input during the high state of the beat cycle (i.e., half of a period of the beat signal). Further, it can be appreciated by persons skilled in the art that the lock detector 300 will work regardless of which input signal is counted by the lock detection module 320 during the beat signal.

Figure 4:
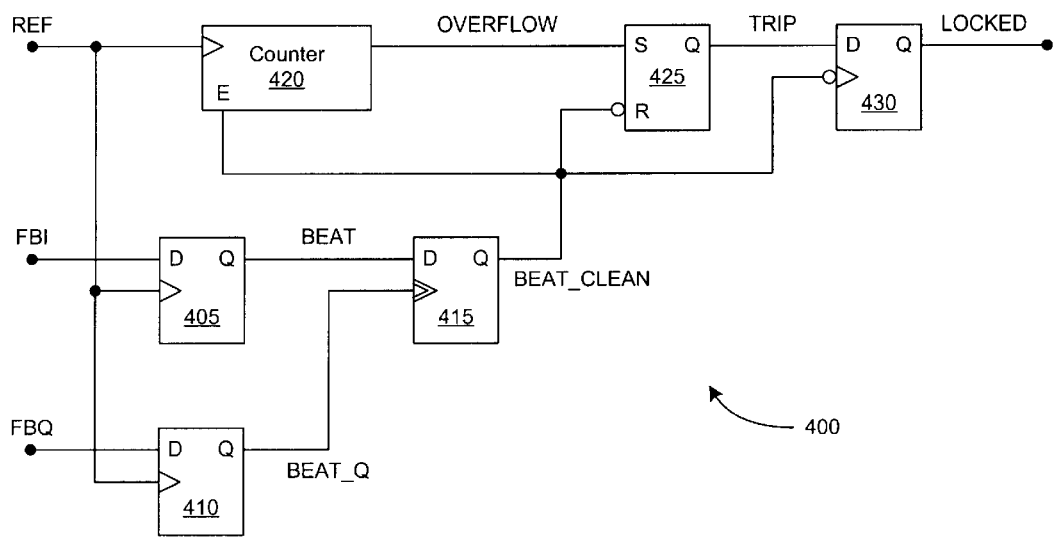
FIG. 4 is a schematic diagram of an embodiment of the lock detector.

FIG. 4 shows a schematic of a lock detector circuit 400 in accordance with an embodiment of the present invention. Although FIG. 4 (and FIG. 6, discussed below) depict the circuit 400 using simple logic components, one skilled in the art will understand that a variety of equivalents can be used to implement the present invention. For example, depending on the application, some or all of the modules or circuit components could be implemented using known equivalents, or partially or in full by firmware or software. In addition, in one preferred embodiment differential logic components are used. Differential logic is advantageous for high-speed applications such as optical communications networks because it effectively doubles the signal amplitude (thus requiring less signal size), it reduces noise effects, and it cancels drift.

The circuit 400 determines if the two input signals differ by more than a prescribed percentage. A first input signal is REF, which in one embodiment is a square wave that corresponds to a master clock frequency for the system. A second input signal represented by FBI, which in one embodiment is a locally-generated square wave internally divided down in frequency. A phase shifted version of the second input signal is represented by FBQ, which is preferably a quadrature version of the second input signal (i.e., delayed by 90 degrees, or a quarter cycle). FBI and FBQ can be generated at the same time, for example, by a standard VCO or other local oscillator, or one of the signals can be generated from the other using a simple delay. Although a phase delay of about 90 degrees is preferred, the actual amount shifted is not critical. The quadrature clock signals need not be exactly in quadrature and can even vary significantly from a 90-degree phase shift in some applications.

A BEAT signal is created by inputting the REF and FBI signals into the D and clock inputs of a D flip-flop 405. Similarly, a BEAT_Q signal is created by inputting the REF and FBQ signals into the D and clock inputs of another D flip-flop 410. The phase delay between FBI and FBQ controls the phase difference between the BEAT and BEAT_Q signals. Preferably, the FBQ signal is in quadrature with the FBI signal, which causes the BEAT_Q signal to be in quadrature with the BEAT signal. As shown in the timing diagram of FIG. 5, this arrangement of the signals maximizes the time between the chatter in the BEAT and BEAT_Q signals. The smallest desirable delay between the BEAT and BEAT_Q signals is related to the duration of the chatter. It can be appreciated that first and second input signals can be swapped from the configuration shown in FIG. 4; that is, the REF signal can be coupled to the D input of the flip-flops 405,410 and the FBI and FBQ can be coupled to the clock inputs.

Figure 5:
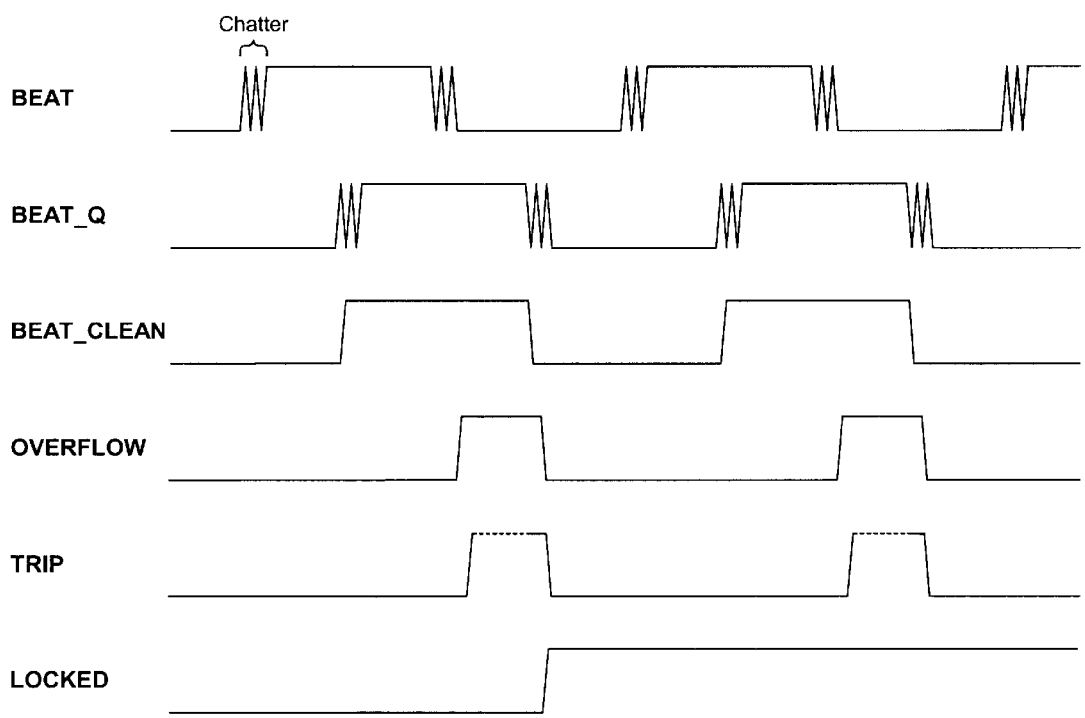
FIG. 5 is a timing diagram for the lock detector of FIG. 4.

The two chattery BEAT and BEAT_Q signals are coupled to the D and clock inputs of a dual-edge triggered D flip-flop 415, respectively. Again, the circuit 400 will operate correctly regardless of which beat signal is attached to which input of the flip-flop 415. As shown in FIG. 5, the dual-edge triggered D flip-flop 415 outputs a BEAT_CLEAN signal that is free of chatter. Because the two chattery beat signals are combined to produce a chatter-free BEAT_CLEAN signal, it is preferred that the chatter in the BEAT and BEAT_Q signals does not overlap; otherwise, the dual-edge triggered D flip-flop 415 might not fully remove the chatter to produce a clean beat signal.

The timing diagram in FIG. 5 shows how BEAT and BEAT_Q are used to produce BEAT_CLEAN. Although BEAT_CLEAN cycles at the same frequency as BEAT and BEAT_Q, it does not chatter. This is because the output of the dual-edge triggered flip-flop 415 (i.e., BEAT CLEAN) is only set upon a rising or falling edge of its clock input. Moreover, the D input (i.e., BEAT) remains constant during any period of chatter at the clock input (i.e., BEAT_Q), and the clock input remains constant during any chatter at the D input. Therefore, a slightly shifted (by a an amount of half the chatter) BEAT_CLEAN signal is produced. This chatter-free BEAT_CLEAN signal is then used to control various aspects of the lock detector circuit 400.

The BEAT_CLEAN signal is coupled to enable a counter 420. The counter 420 is shown coupled to count the REF signal; however, the counter 420 can alternatively be coupled to count the FBI or FBQ signals. If the two input signals are close in frequency, then a high count will occur during the beat signal high state, thereby causing the counter to overflow and set a corresponding OVERFLOW signal. The OVERFLOW signal is thus high corresponding to occasions when the frequencies of the input signals are close, i.e., within the prescribed tolerance. Because the tolerance for the number of cycles that occur generating two beat signals between the two inputs signals depends on the configuration of the counter, this tolerance can be easily programmed by reconfiguring the counter.

The OVERFLOW signal is coupled to the "set" input of a SR flip-flop 425, while the inverted BEAT_CLEAN signal is coupled to its "reset" input. The SR flip-flop produces a TRIP signal, which is set by the OVERFLOW signal and then reset by the falling edge of the BEAT_CLEAN signal. D flip-flop 430 uses the TRIP signal to set the LOCKED signal upon the falling edge of the BEAT_CLEAN signal. This LOCKED signal indicates whether the difference between the frequencies of the input signals is within the prescribed tolerance—in other words, whether one input signal is locked onto the other within the allowable tolerance.

If the input signals are too different in frequency, the counter 420 will not count high enough to overflow during the high portion of the BEAT_CLEAN signal. Accordingly, the OVERFLOW signal remains low throughout the BEAT_CLEAN signal. With the OVERFLOW signal low, the TRIP signal is never set to high, which in turn leaves the LOCKED signal in the low state. As described, a low LOCKED signal indicates that the input signals differ by an amount greater than the prescribed tolerance. The LOCKED signal is therefore useful, for example in the context of a SONET communication network, to notify the system that the local oscillator is not correctly calibrated. The system can then retrain the local oscillator or otherwise correct the problem.

Figure 6:
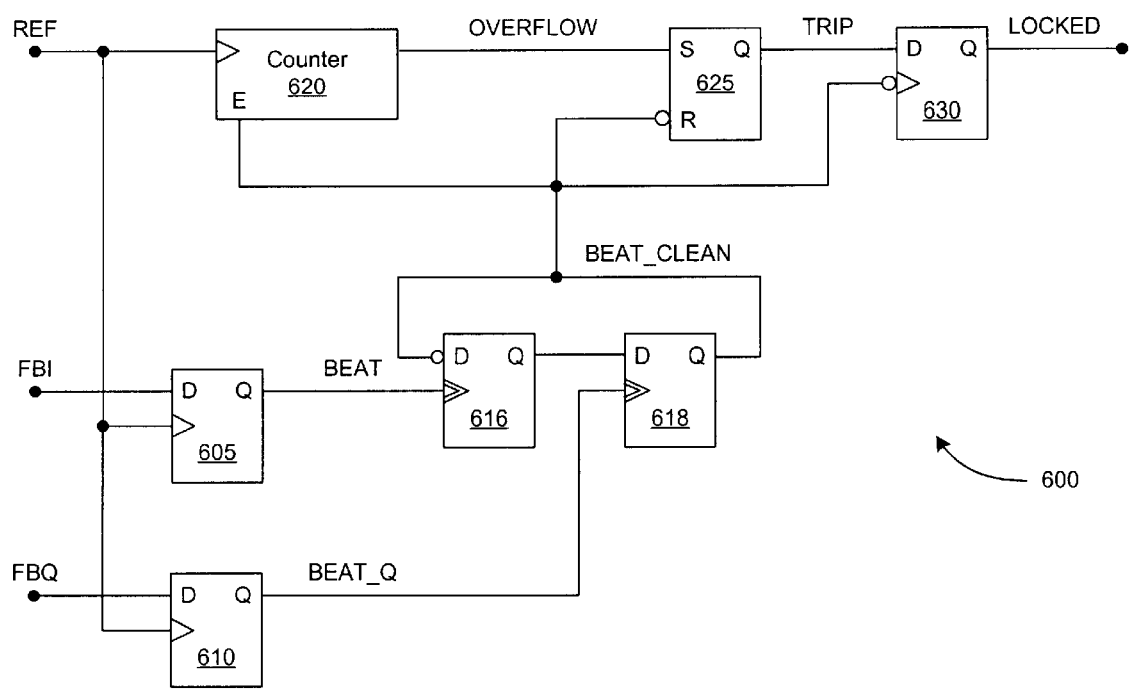
FIG. 6 is a schematic diagram of another embodiment of the lock detector.

FIG. 6 shows another embodiment of a lock detector circuit 600 for detecting a difference between the frequencies of a first and a second input signal. This circuit 600 is identical to the circuit 400 shown in FIG. 4, except that the dual-edge triggered D flip-flop 415 of circuit 400 is replaced with a pair of dual-edge triggered D flip-flops 616,618 configured in a divide-by-¾ loop.

In this embodiment, the chattery BEAT and BEAT_Q signals are coupled to the clock inputs of the flip-flops 616,618, respectively. The output of flip-flops 616 is coupled to the input of flip-flop 618, and the inverted output of flip-flop 618 is fed back to the input of flip-flop 616. With this configuration, the clock input of the first flip-flop 616 chatters as it rises, finally resting on the high state. Then, the clock input of the second flip-flop 618 chatters as it rises, finally resting on the high state. Because the BEAT and BEAT_Q signals at the clock inputs each remain constant while the other signal is chattering, the D input at each flip-flop 616,618 is held constant whenever the clock input is chattering. Therefore, this configuration produces a corresponding BEAT_CLEAN signal, resulting in the same waveforms as shown in FIG. 5.

Those with ordinary skill in the art will recognize that the lock detector can include different elements than those shown in the figures, including various types of combinational and sequential logic, which can be combined to perform functions equivalent to those performed by the various parts of the lock detector. Accordingly, the foregoing description of the embodiments of the invention has been presented for the purposes of illustration and description. It is not intended to be exhaustive or to limit the invention to the precise forms disclosed. Persons skilled in the relevant art can appreciate that many modifications and variations are possible in light of the above teaching. It is therefore intended that the scope of the invention be limited not by this detailed description, but rather by the claims appended hereto.

I claim:

1. An apparatus for detecting a difference between the frequencies of a first and a second input signal, the apparatus comprising:

a first beat generator configured to generate a first beat signal based on the first and second input signals;

a second beat generator configured to generate a second beat signal based on the first input signal and a phase shifted second input signal, the second beat signal being phase shifted relative to the first beat signal;

a chatter elimination module in communication with the first and second beat generators, the chatter elimination module configured to produce a third beat signal having about the same frequency as the first and second beat signals and being substantially free of chatter; and a lock detection module configured to receive the third beat signal and one of the first and second input signals, and produce a lock detection signal therefrom, the lock detection signal indicating whether the difference between the frequencies of the first and second input signals is within a prescribed tolerance.

2. The apparatus of claim 1, wherein the first input signal is a recovered clock signal generated by a local oscillator, and the second input signal is a reference clock signal.

3. The apparatus of claim 1, wherein the first beat generator comprises a D flip-flop having a D input and a clock input, the D input for receiving the first input signal, and the clock input for receiving the second input signal, thereby causing the D flip-flop to output the first beat signal.

4. The apparatus of claim 1, wherein the second beat generator is adapted to receive the phase shifted second input signal, the second beat generator further configured to produce the second beat signal by combining the first input signal and the phase shifted second input signal.

5. The apparatus of claim 1, further comprising:
a local oscillator for generating the second input signal and the phase shifted second input signal, the local oscillator being coupled to provide the second input signal to the first beat generator, and further coupled to provide the phase shifted second input signal to the second beat generator.

6. The apparatus of claim 1, wherein the second beat signal is in quadrature relative to the first beat signal.

7. The apparatus of claim 1, wherein the second beat signal is phase shifted relative to the first beat signal by an amount greater than a period of any chatter that occurs during a rise or fall of either of the first and second beat signals.

8. The apparatus of claim 1, wherein the chatter elimination module includes a dual-edged D flip-flop having a D input and a clock input, the D input coupled to one of the first and second beat signals, and the clock input coupled to the other of the first and second beat signals, thereby causing the dual-edged D flip-flop to output the third beat signal.

9. The apparatus of claim 1, wherein the lock detection module includes a counter configured to count the number of cycles of either the first or second input signals that occur during at least a portion of the third beat signal, and further wherein the lock detection module sets the lock detection signal based on whether the number of counted cycles exceeds a predetermined number.

10. A lock detector for determining whether a local oscillator of a clock recovery unit is locked onto a reference clock signal, the local oscillator producing a local clock signal and a corresponding phase-shifted local clock signal, the lock detector comprising:
a first beat generator for receiving the reference clock signal and the local clock signal, the first beat generator configured to produce a first beat signal therefrom;
a second beat generator for receiving the reference clock signal and the phase shifted local clock signal, the second beat generator configured to produce a second beat signal therefrom;
a module for combining the first and second beat signals to produce a corresponding third beat signal, the third beat signal being substantially free of chatter; and
a lock detection indicator configured to count the number of cycles of either the reference or local clock signals that occur during at least a portion of the third beat signal, the lock detection indicator producing a lock detection signal that indicates whether the counted number of cycles exceeds a predetermined number.

11. The lock detector of claim 10, wherein the phase-shifted local clock signal is in quadrature relative to the local clock signal.

12. The lock detector of claim 10, further comprising a counter, wherein the lock detection signal is set by an overflow bit of the counter.

13. A method for detecting a difference between the frequencies of a first and a second input signal, the method comprising:
generating a first beat signal based on the first and second input signals;
generating a second beat signal based on the first input signal and a phase shifted second input signal, the second beat signal being phase shifted relative to the first beat signal;
combining the first and second beat signals to generate a third beat signal having substantially the same frequency as the first and second beat signals, the third beat signal being substantially free of chatter; and
producing a lock detection signal using the third beat signal and one of the first and second input signals, the lock detection signal indicating whether the difference between the frequencies of the first and second input signals is within a prescribed tolerance.

14. The method of claim 13, wherein the first input signal is a recovered clock signal generated by a local oscillator, and the second input signal is a reference clock signal.

15. The method of claim 13, wherein generating the first beat signal comprises coupling the first input signal to a clock input of a D flip-flop and coupling the second input signal to a D input of the D flip-flop, thereby causing the D flip-flop to output the first beat signal.

16. The method of claim 13, wherein generating the second beat signal comprises:
receiving the phase shifted second input signal; and
combining the first input signal and the phase shifted second input signal to produce the second beat signal.

17. The method of claim 13, further comprising:
receiving the second input signal from a local oscillator, the local oscillator being coupled to provide the second input signal for generating the first beat signal, and further coupled to provide the phase shifted second input signal for generating the second beat signal.

18. The method of claim 13, wherein the second beat signal is phase shifted relative to the first beat signal by about one quarter of a cycle.

19. The method of claim 13, wherein the second beat signal is phase shifted relative to the first beat signal by an amount greater than a period of any chatter that occurs during the a rise or fall of either of the first and second beat signals.

20. The method of claim 13, wherein combining the first and second beat signals comprises coupling one of the first and second beat signals to a clock input of a dual-edged D flip-flop and coupling the other of the first and second beat signals to a D input of the dual-edged D flip-flop, thereby causing the dual-edged D flip-flop to output the third beat signal.

21. The method of claim 13, wherein producing the lock detection signal comprises:
counting the number of cycles of either the first or second input signals that occur during at least a portion of the third beat signal; and
setting the lock detection signal based on whether the counted number of cycles exceeds a predetermined number.

\* \* \* \* \*